(12) United States Patent
Park

(10) Patent No.: US 8,477,262 B2
(45) Date of Patent: Jul. 2, 2013

(54) BACKLIGHT UNIT AND DISPLAY DEVICE USING THE SAME

(75) Inventor: Dong Wook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 174 days.

(21) Appl. No.: 12/986,678

(22) Filed: Jan. 7, 2011

(65) Prior Publication Data
US 2011/0176087 A1 Jul. 21, 2011

(30) Foreign Application Priority Data
Jan. 15, 2010 (KR) ......................... 10-2010-0004103

(51) Int. Cl.
*G02F 1/13357* (2006.01)
(52) U.S. Cl.
USPC ........................................................ 349/65
(58) Field of Classification Search
None
See application file for complete search history.

(56) References Cited

U.S. PATENT DOCUMENTS

| 7,579,198 B2 * | 8/2009 | Hsu .................................. 438/22 |
| 8,092,067 B2 * | 1/2012 | Huang et al. .................. 362/618 |
| 2002/0180923 A1 * | 12/2002 | Aoyagi et al. ............... 349/149 |
| 2004/0074902 A1 | 4/2004 | Hayes et al. ................. 220/4.21 |
| 2004/0208210 A1 * | 10/2004 | Inoguchi ......................... 372/36 |
| 2006/0202621 A1 | 9/2006 | Yoo |
| 2007/0109792 A1 * | 5/2007 | Chosa et al. .................. 362/341 |
| 2008/0088763 A1 | 4/2008 | Toriyama et al. ............... 349/58 |
| 2008/0170177 A1 * | 7/2008 | Chen ................................ 349/64 |
| 2008/0180972 A1 | 7/2008 | Sakamoto et al. |
| 2009/0015754 A1 * | 1/2009 | Pai ................................... 349/65 |
| 2009/0109368 A1 * | 4/2009 | Watanabe et al. ............... 349/58 |
| 2010/0053504 A1 * | 3/2010 | Klim et al. ...................... 349/65 |

FOREIGN PATENT DOCUMENTS

| JP | 2008-140849 | 6/2008 |
| JP | 2008-186780 | 8/2008 |
| KR | 10-2008-0032834 | 4/2008 |
| KR | 10-2008-0061763 | 7/2008 |
| KR | 10-2009-0104521 | 10/2009 |

OTHER PUBLICATIONS

European Search Report dated May 24, 2011 issued in Application No. 11 15 0955.
Korean Office Action issued in KR Application No. 10-2010-004103 dated Oct. 21, 2010.

* cited by examiner

*Primary Examiner* — Mike Stahl
(74) *Attorney, Agent, or Firm* — KED & Associates, LLP

(57) ABSTRACT

Disclosed are a backlight unit and a display device using the same. The backlight unit includes a light guide plate, a light emitting module provided on at least one lateral surface of the light guide plate to supply light to the light guide plate, and a bottom cover to contain the light guide plate and the light emitting module. The light emitting module includes a substrate including a plurality of through holes and a plurality of light emitting devices which are inserted into the through holes and spaced apart from the light guide plate at a first distance.

20 Claims, 4 Drawing Sheets

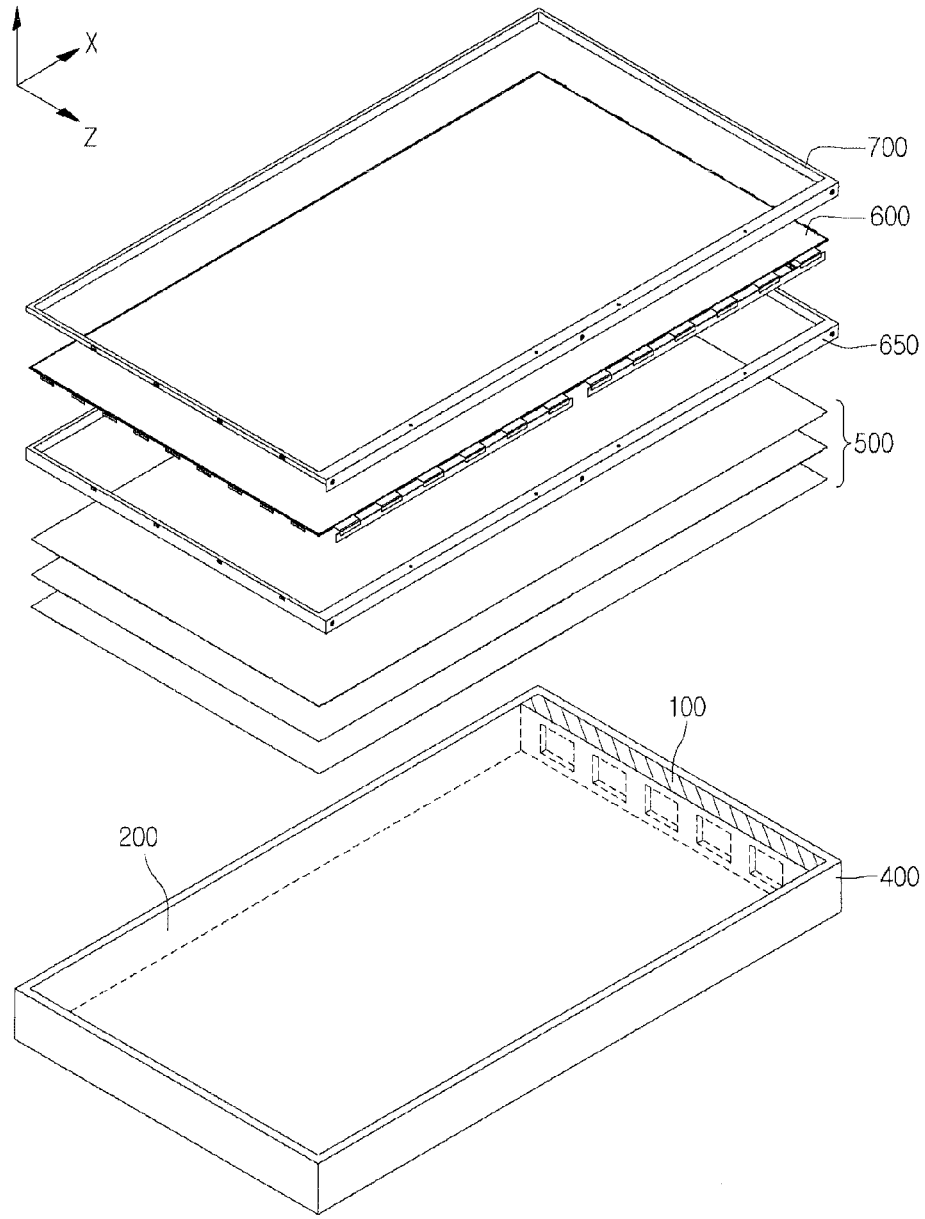

US 8,477,262 B2

BACKLIGHT UNIT AND DISPLAY DEVICE USING THE SAME

CROSS-REFERENCE TO RELATED APPLICATIONS

The present application claims priority under 35 U.S.C. 119 and 35 U.S.C. 365 to Korean Patent Application No. 10-2010-0004103 (filed on Jan. 15, 2010), which is hereby incorporated by reference in its entirety.

BACKGROUND

The embodiment relates to a backlight unit and a display device using the same.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a backlight unit having a novel structure and a display device using the same.

The embodiment provides a backlight unit capable of improving reliability and a display device using the same.

According to the embodiment, the backlight unit includes a light guide plate, a light emitting module provided on at least one lateral surface of the light guide plate to supply light to the light guide plate, and a bottom cover to contain the light guide plate and the light emitting module. The light emitting module includes a substrate including a plurality of through holes and a plurality of light emitting devices which are inserted into the through holes and spaced apart from the light guide plate at a first distance.

According to the embodiment, the display device includes a light guide plate, a light emitting module provided over at least one lateral surface of the light guide plate to supply light to the light guide plate, a bottom cover to contain the light guide plate and the light emitting module, in which the light emitting module includes a substrate including a plurality of through holes and a plurality of light emitting devices which are inserted into the through holes and spaced apart from the light guide plate at a first distance; and a liquid crystal panel over the backlight unit.

The embodiment can provide a backlight unit having a novel structure and a display device using the same.

The embodiment can provide a backlight unit capable of improving reliability and a display device using the same.

BRIEF DESCRIPTION OF THE DRAWINGS

FIG. 8 is a perspective view showing a display device including the backlight unit according to the disclosure.

DETAILED DESCRIPTION OF THE EMBODIMENTS

Figure 1:
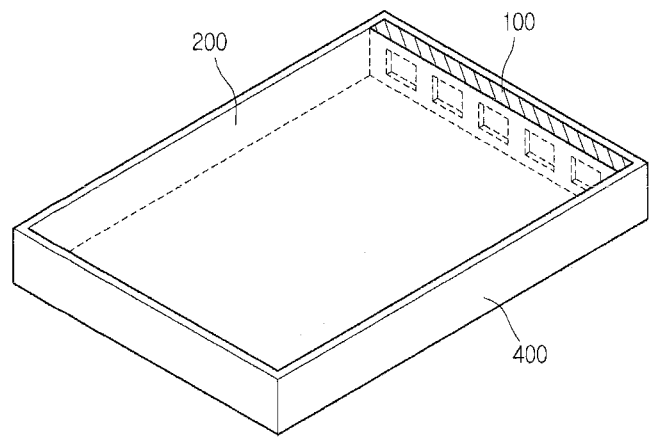
FIG. 1 is a perspective view showing a backlight unit according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a backlight unit according to the embodiments and a display device using the same will be described with reference to accompanying drawings.

<Embodiment 1>

Figure 2:
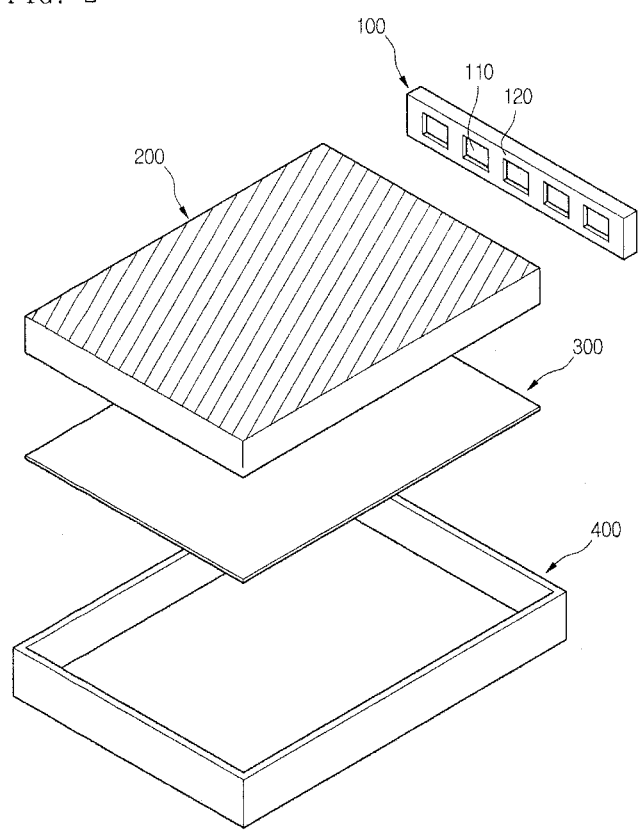
FIG. 2 is an exploded perspective view showing the backlight unit of FIG. 1.

FIG. 1 is a perspective view showing a backlight unit according to a first embodiment, and FIG. 2 is an exploded perspective view showing the backlight unit of FIG. 1

Referring to FIGS. 1 and 2, the backlight unit according to the embodiment includes a light guide plate 200, a light emitting module 100 making contact with at least one lateral surface of the light guide plate 200 to supply light to the light guide plate 200, a reflective member 300 under the light guide plate 200, and a bottom cover 400 to contain the light guide plate 200, the light emitting module 100, and the reflective member 300.

The light guide plate 200 diffuses light to supply surface light. The light guide plate 200 includes a transparent material. For example, the light guide plate 200 may include one selected from the group consisting of acryl-based resin, such as PMMA (polymethyl methacrylate), PET (polyethylene terephthalate), PC (polycarbonate), COC (cycloolefin copolymer) and PEN (polyethylene naphthalate) resin.

The light emitting module 100 supplies the light to at least one lateral side of the light guide plate 200 and serves as the light source of a display device including the backlight unit.

The light emitting module 100 may be positioned adjacent to the light guide plate 200. In detail, the light emitting module 100 includes a substrate 120 and a plurality of light emitting devices 110 installed on the substrate 120, and the substrate 120 may be adjacent to the light guide plate 200.

The light emitting devices 110 are inserted into a plurality of through holes formed in the substrate 120 in such a manner that a light exit surface to emit light is spaced apart from the light guide plate 200 at a first distance, and details thereof will be described in detail below.

The reflective member 300 may be formed under the light guide plate 200. The reflective member 300 reflects light, which is incident through a bottom surface of the light guide plate 200, upward, so that the brightness of the backlight unit may be improved. The reflective member 300 may include resin PET, PC, or PVC, but the embodiment is not limited thereto.

The bottom cover 400 may contain the light guide plate 200, the light emitting module 100, and the reflective member 300 therein. To this end, the bottom cover 400 has a box shape with an open top surface, but the embodiment is not limited thereto.

The bottom cover 400 may be manufactured through a press process or an extrusion process by using metallic material or resin material.

Hereinafter, the light emitting module 100 will be described in more detail.

Figure 3:
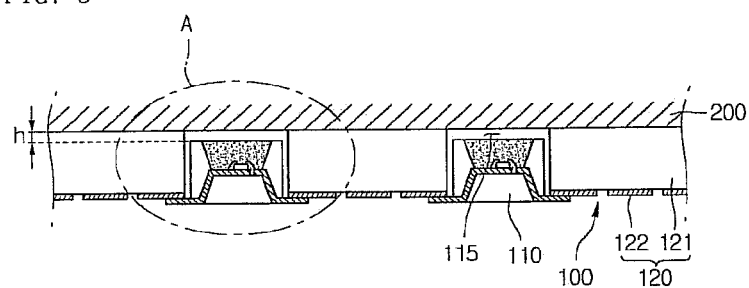
FIG. 3 is a view showing a light emitting module and a light guide plate of the backlight unit of FIG. 1.
Figure 4:
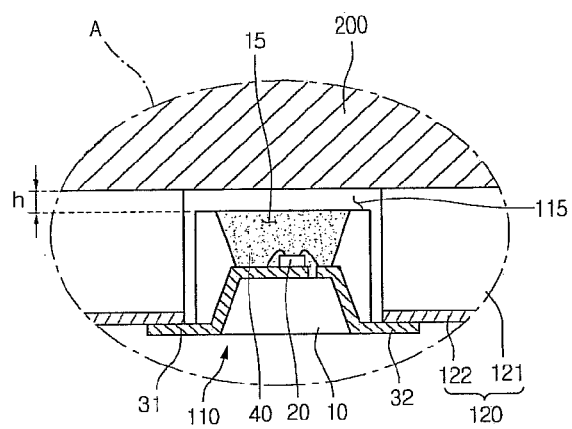
FIG. 4 is an enlarged view showing a region A of FIG. 3.

FIG. 3 is a view showing the light emitting module 100 and the light guide plate 200, and FIG. 4 is an enlarged view showing a region A of FIG. 3.

Referring to FIGS. 3 and 4, the light guide module 100 includes the substrate 120 and the light emitting devices 110 inserted into through holes 115 formed in the substrate 120.

One surface of the substrate 120 may make contact with the light guide plate 200. Since the substrate 120 has a relatively uniform thickness throughout the whole area thereof, the whole area of one surface of the substrate 120 may make contact with the light guide plate 200.

The substrate 120 may include an insulating layer 121 and a PCB (Printed Circuit Board) including a circuit pattern 122 formed on at least one surface of the insulating layer 121. The substrate 120 may include an MCPCB (Metal Core PCB) or an FPCB (Flexible PCB) in addition to a typical PCB, but the embodiment is not limited thereto.

In addition, the substrate 120 may be provided therein with the through holes 115. The through holes 115 may penetrate from the top surface to the bottom surface of the insulating layer 121 of the substrate 120. The through holes 115 may be formed corresponding to the size and the shape of the light emitting devices 110 such that the light emitting devices 110 may be inserted into the through holes 115. In addition, positions at which the through holes 115 are formed may be determined according to the arrangement of the light emitting devices 110.

The light emitting devices 110 may be inserted into the through holes 115 of the substrate 120. Electrodes 31 and 32 of the light emitting devices 110 may be electrically connected to the circuit pattern 122 formed on a surface of the substrate 120 that does not face the light guide plates 200. The light emitting devices 110 may generate light by power delivered through the circuit pattern 122.

The light emitting devices 110 may be inserted into the through holes 115 in such a manner that the light emitting devices 110 may maintain a first distance h from the light guide plate 200. In other words, the light exit surfaces of the light emitting devices 110 may be spaced apart from the light guide plate 200 at the first distance h.

To this end, the light emitting devices 110 may have a thickness smaller than a depth of the through holes 115, or a part of the light emitting device 110 protrudes out of a rear surface of the substrate 120, but the embodiment is not limited thereto.

The first distance h may be in the range of about 0.05 mm to about 0.5 mm. Preferably, the first distance h may be in the range of about 0.05 mm to about 0.15 mm.

The light emitting devices 110 are spaced apart from the light guide plate 200 at the first distance h, so that light emitted from the light emitting devices 110 may be effectively diffused within the light guide plate 200 without distortion.

In addition, according to another embodiment, the light emitting devices 110 can be prevented from making contact with the light guide plate 200, so that degradation of the light emitting devices 110 caused by heat or pressure transmitted from the light guide plate 200 can be prevented.

Hereinafter, the light emitting device 110 will be described in detail.

Referring to FIG. 4, the light emitting device 110 includes a body 10, a plurality of electrodes 31 and 32 installed in the body 10, a light emitting chip 20 installed in the body 10 and electrically connected to the electrodes 31 and 32, and an encapsulant 40 to seal the light emitting chip 20.

The body 10 may include at least one selected from the group consisting of a resin material such as PPA (Polyphthalamide), Si, metallic material, PSG (Photo Sensitive Glass), $Al_2O_3$, and a PCB.

A top surface of the body 10 may have various shapes such as a rectangular shape, a polygonal shape, and a circular shape according to the usage and the design of the light emitting device 110.

The body 10 may be provided therein with a cavity 15 to open an upper portion of the body 10. The cavity 15 may have a cup shape or a concave vessel shape. The cavity 15 may have an inner lateral surface perpendicular to a bottom surface of the cavity 15 or inclined with respect to the bottom surface of the cavity 15. In addition, when viewed in a plan view, the cavity 15 may have a circular shape, a rectangular shape, a polygonal shape, or an oval shape.

The electrodes 31 and 32 are spaced apart from each other in the body 10 in such a manner that the electrodes 31 and 32 are electrically insulated from each other. The electrodes 31 and 32 are electrically connected to the light emitting chip 20 to supply power to the light emitting chip 20.

The electrodes 31 and 32 may include metallic material, for example, at least one selected from the group consisting of Ti, Cu, Ni, Au, Cr, Ta, Pt, Sn, Ag, and P.

The electrodes 31 and 32 are exposed through the rear surface of the body 10, and electrically connected to the circuit pattern 122 of the substrate 120 to receive power.

The light emitting chip 20 may be mounted on one of the electrodes 31 and 32 or may be mounted on the body 10. The light emitting chip 20 may be electrically connected to the electrodes 31 and 32 to receive power, thereby generating light.

For example, the light emitting chip 20 may include at least one light emitting diode (LED). The LED may include a color LED that emits the light having the color of red, green, blue or white and a UV (ultraviolet) LED that emits UV light, but the embodiment is not limited thereto.

As shown in FIG. 4, the light emitting chip 20 may be electrically connected to the electrodes 31 and 32 through a wire bonding scheme, or may be electrically connected to the electrodes 31 and 32 through a flip chip scheme or a die bonding scheme.

The encapsulant 40 may be formed in the cavity 15 of the body 10 to protect the light emitting chip 20 by sealing the light emitting chip 20. The encapsulant 40 may include a phosphor. In this case, a top surface of the encapsulant 40 may serve as a light exit surface to emit light generated from the light emitting chip 20.

The encapsulant 40 may include a silicon material or a resin material. The phosphor is contained in the encapsulant 40 and excited by first light emitted from the light emitting chip 20 to generate second light.

<Embodiment 2>

Hereinafter, a backlight unit according to a second embodiment will be described, but details of component and structures, which have been previously described, will be omitted in order to avoid redundancy or will be simplified.

Figure 5:
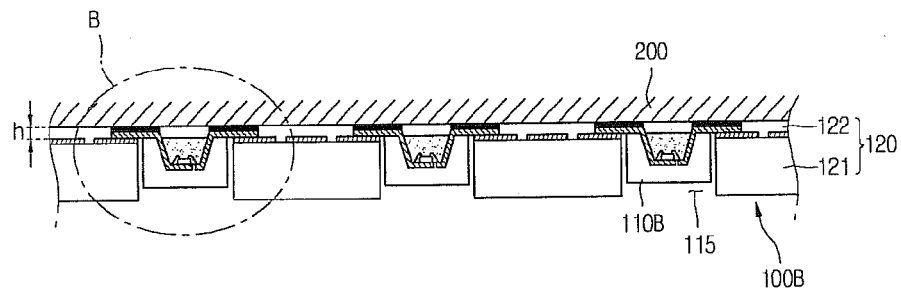
FIG. 5 is a view showing a light emitting module and a light guide plate of a backlight unit according to a second embodiment.
Figure 6:
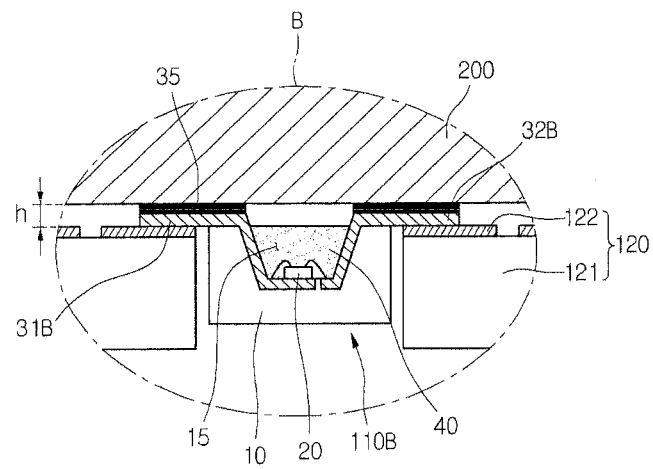
FIG. 6 is an enlarge view showing a region B of FIG. 5.

FIG. 5 is a view showing a light emitting module and a light guide plate of the backlight unit according to the second embodiment, and FIG. 6 is an enlarged view showing a region B of FIG. 5.

The backlight unit according to the second embodiment has the same structure as that of the backlight unit according to the first embodiment except for the shape of the light emitting module and the arrangement relation between the light emitting module and the light guide plate.

Referring to FIGS. 5 and 6, in the backlight unit according to the second embodiment, a light emitting module 100B makes contact with at least one lateral surface of the light guide plate 200.

The light emitting module 100B includes the substrate 120 and a plurality of light emitting devices 110B inserted into the through holes 115 of the substrate 120.

A plurality of electrodes 31B and 32B of the light emitting devices 110E may be electrically connected to the circuit pattern 122 formed on the top surface of the substrate 120 to receive power.

The electrodes 31B and 32B may be provided on top surfaces thereof with bonding layers 35 so that the electrodes 31B and 32B make contact with the light guide plate 200 to fix the light emitting module 100B to the light guide plate 200.

For example, the bonding layer 35 may include metal or a resin material, such as solder or epoxy resin, representing strong bonding strength, but the embodiment is not limited thereto.

The bonding layer 35 and the electrodes 31B and 32B space the light exit surface of the light emitting device 110B apart from the light guide plate 200 at the first distance h, so that light emitted from the light emitting devices 110B can be effectively diffused within the light guide plate 200 without distortion. Meanwhile, the bonding layer 35 and the electrodes 31B and 32B can prevent the light emitting devices 110B from being degraded due to heat or pressure transmitted from the light guide plate 200.

<Embodiment 3>

Hereinafter, a backlight unit according to a third embodiment will be described, but details of component and structures, which have been previously described, will be omitted in order to avoid redundancy or will be simplified.

Figure 7:
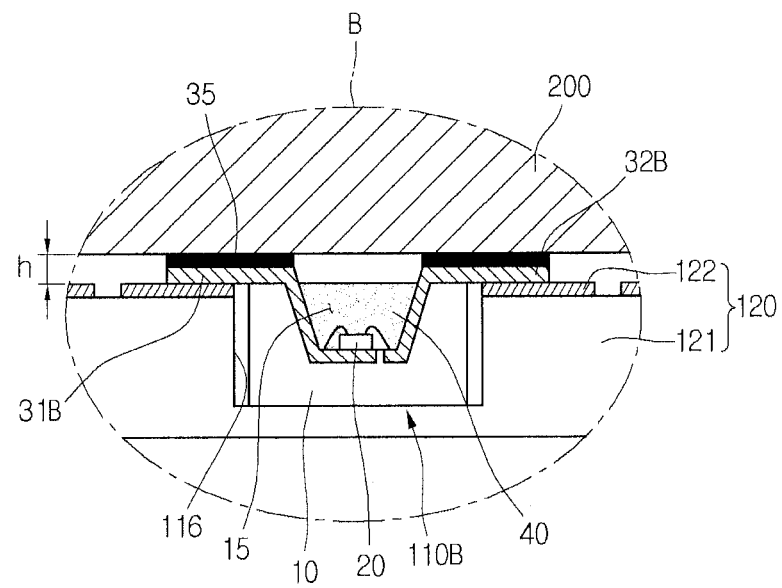
FIG. 7 is an enlarged view showing a light emitting module and a light guide plate of a backlight unit according to a third embodiment.

FIG. 7 is an enlarged view showing a light emitting module and a light guide plate of the backlight unit according to the third embodiment.

The backlight unit according to the third embodiment has the same structure as that of the backlight unit according to the second embodiment except for the shape of a substrate.

Referring to FIG. 7, the light emitting module 100B makes contact with at least one lateral surface of the light guide plate 200.

The light emitting module 100B includes the substrate 120 and the light emitting devices 110B inserted into the groove 116 of the substrate 120.

The substrate 120 includes a plurality of grooves 116 to contain the light emitting devices 110B.

In other words, in the backlight unit of FIG. 6, the substrate 120 is provided therein with the through holes 115 to contain the light emitting devices 110B. In contrast, in the backlight unit of FIG. 7, the light emitting module 100B is contained in the grooves 116, so that the substrate 10 supports the light emitting devices 110B.

The electrodes 31B and 32B of the light emitting devices 110B may be electrically connected to the circuit pattern 122 formed on the top surface of the substrate 120 to receive power.

Meanwhile, the electrodes 31B and 32B may be provided on top surfaces thereof with the bonding layers 35 so that the electrodes 31B and 32B make contact with the light guide plate 200 to fix the light emitting module 100B to the light guide plate 200.

For example, the bonding layer 35 may include metal or a resin material, such as solder or epoxy resin, representing strong bonding strength, but the embodiment is not limited thereto.

The bonding layer 35 and the electrodes 31B and 32B space the light exit surface of the light emitting device 110B apart from the light guide plate 200 at the first distance h, so that light emitted from the light emitting devices 110B can be effectively diffused within the light guide plate 200 without distortion. Meanwhile, the bonding layer 35 and the electrodes 31B and 32B can prevent the light emitting devices 110B from being degraded due to heat or pressure transmitted from the light guide plate 200.

Hereinafter, a display device employing the backlight unit according to the disclosure will be described. FIG. 8 is a perspective view showing the display device including the backlight unit according to the disclosure.

An optical sheet 500 and a liquid crystal panel 600 are provided over the backlight unit according to the embodiment, and a top cover 700 is provided to contain and support the backlight unit, the optical sheet 500, and the liquid crystal panel 600, thereby manufacturing the display device.

The optical sheet 500 is provided on the backlight unit. For example, the optical sheet 500 may include a diffusion sheet to diffuse light, a light collecting sheet to collect diffused light, and a protective sheet to protect patterns formed on the light collecting sheet.

The liquid crystal panel 600 is provided over the optical sheet 500. For example, the liquid crystal panel 600 includes a thin film transistor substrate including a plurality of TFTs (Thin Film Transistors), a color filter substrate provided over the thin film transistor substrate, and liquid crystal interposed between the thin film transistor substrate and the color filter substrate. In addition, the thin film transistor substrate may be provided at one terminal thereof with IC chips (Integrated Circuit Chips). The IC chips generate image signals, scan signals, and a plurality of timing signals used to apply the image signals or the scan signals, in which the image signals, the scan signals, and the timing signals are used to drive a liquid crystal display, and apply the image signals and the scan signals to gate and data lines of the liquid crystal panel 600.

The top cover 700 is coupled with the bottom cover 400 through a coupling member 650 to contain and support the backlight unit.

Other structures of the display device will be not further described because the structures are generally known to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A backlight unit comprising:
a light guide plate;
a light emitting module provided on at least one lateral surface of the light guide plate to supply light to the light guide plate; and
a bottom cover to contain the light guide plate and the light emitting module,
wherein the light emitting module includes a substrate including a plurality of through holes and a plurality of light emitting devices that are inserted into the through holes and spaced apart from the light guide plate by a first distance, and each of the light emitting devices include electrodes that are electrically connected to a circuit pattern formed on a surface of an insulating layer that faces the light guide plate,
a bonding layer over a top surface of the electrodes, wherein the bonding layer contacts the light guide plate.

2. The backlight unit of claim 1, wherein the first distance is in a range of 0.05 mm to 0.5 mm.

3. The backlight unit of claim 1, wherein the substrate includes the insulating layer, the through holes formed in the insulating layer, and a circuit pattern formed on at least one surface of the insulating layer.

4. The backlight unit of claim 1, wherein light exit surfaces of the light emitting devices are spaced apart from the light guide plate by the first distance.

5. The backlight unit of claim 1, wherein the bonding layer includes solder or epoxy resin.

6. The backlight unit of claim 1, wherein each light emitting device includes a body, first and second electrodes installed in the body, a light emitting chip formed over at least one of the first and second electrodes and electrically connected to the first and second electrodes, and an encapsulant to seal the light emitting chip, wherein a top surface of the encapsulant constitutes a light exit surface of the light emitting device.

7. The backlight unit of claim 6, wherein the light emitting chip includes at least one light emitting diode.

8. The backlight unit of claim 1, wherein the substrate includes one of a printed circuit board, a flexible printed circuit board, and a metal core printed circuit board.

9. The backlight unit of claim 1, wherein each light emitting device has a thickness that is less than a depth of the through hole.

10. The backlight unit of claim 1, wherein a part of each light emitting device protrudes out of a rear surface of the substrate.

11. A display device comprising:
a backlight unit of claim 1; and
a liquid crystal panel over the backlight unit.

12. The display device of claim 11, wherein the first distance is in a range of 0.05 mm to 0.5 mm.

13. A backlight unit comprising:
a light guide plate;
a light emitting module provided on at least one lateral surface of the light guide plate to supply light to the light guide plate; and
a bottom cover to contain the light guide plate and the light emitting module,
wherein the light emitting module includes a substrate having a plurality of through holes and a plurality of light emitting devices provided in the through holes and spaced apart from the light guide plate by a first distance,
wherein the substrate includes a front surface to face the at least one lateral surface of the light guide plate and a rear surface, and
wherein each of the light emitting devices includes a plurality of electrodes that are electrically coupled to a circuit board formed on the rear surface of the substrate.

14. The backlight unit of claim 13, wherein the first distance is in a range of 0.05 mm to 0.5 mm.

15. The backlight unit of claim 13, wherein light exit surfaces of the light emitting devices are spaced apart from the light guide plate by the first distance.

16. The backlight unit of claim 13, wherein each light emitting device includes a body, first and second electrodes provided in the body, a light emitting chip formed over at least one of the first and second electrodes and being electrically coupled to the first and second electrodes, and an encapsulant to seal the light emitting chip, wherein a top surface of the encapsulant constitutes a light exit surface of the light emitting device.

17. The backlight unit of claim 16, wherein the light emitting chip includes at least one light emitting diode.

18. The backlight unit of claim 13, wherein the substrate includes one of a printed circuit board, a flexible printed circuit board, and a metal core printed circuit board.

19. The backlight unit of claim 13, wherein each light emitting device has a thickness that is smaller than a depth of the through hole.

20. The backlight unit of claim 13, wherein a part of each light emitting device protrudes out from the rear surface of the substrate.

* * * * *